(12) United States Patent
Mao

(10) Patent No.: US 10,586,937 B2
(45) Date of Patent: Mar. 10, 2020

(54) THIN FILM TRANSISTOR, FABRICATING METHOD AND DRIVING METHOD THEREOF, AND DISPLAY DEVICE

(71) Applicant: BOE Technology Group Co., Ltd., Beijing (CN)

(72) Inventor: Defeng Mao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/941,340

(22) Filed: Mar. 30, 2018

(65) Prior Publication Data

US 2019/0081259 A1 Mar. 14, 2019

(30) Foreign Application Priority Data

Sep. 12, 2017 (CN) .......................... 2017 1 0818794

(51) Int. Cl.
| | | |
|---|---|---|
| *H01L 51/05* | (2006.01) | |
| *H01L 27/12* | (2006.01) | |
| *H01L 51/00* | (2006.01) | |
| *H01L 51/10* | (2006.01) | |

(52) U.S. Cl.
CPC ...... *H01L 51/0558* (2013.01); *H01L 27/1222* (2013.01); *H01L 27/1229* (2013.01); *H01L 27/1237* (2013.01); *H01L 27/1251* (2013.01); *H01L 51/0048* (2013.01); *H01L 51/0541* (2013.01); *H01L 51/107* (2013.01)

(58) Field of Classification Search
CPC ............. H01L 27/1229; H01L 27/1237; H01L 27/1251
USPC ......................................................... 257/29
See application file for complete search history.

(56) References Cited

U.S. PATENT DOCUMENTS

| | | | | |
|---|---|---|---|---|
| 2006/0255414 A1* | 11/2006 | Appenzeller | .......... | B82Y 10/00 257/401 |
| 2011/0248243 A1* | 10/2011 | Chen | ...................... | B82Y 10/00 257/29 |
| 2015/0220199 A1* | 8/2015 | Wang | ........................ | G06F 3/16 345/173 |
| 2015/0276663 A1* | 10/2015 | Takechi | ............... | G01N 27/414 257/253 |

(Continued)

FOREIGN PATENT DOCUMENTS

| | | |
|---|---|---|
| CN | 1555096 A | 12/2004 |
| CN | 103608749 A | 2/2014 |

(Continued)

OTHER PUBLICATIONS

First Office Action dated Aug. 28, 2019 corresponding to Chinese application No. 201710818794.6.

*Primary Examiner* — David Vu
*Assistant Examiner* — Brandon C Fox
(74) *Attorney, Agent, or Firm* — Nath, Goldberg & Meyer; Joshua B. Goldberg

(57) ABSTRACT

The present application provides a thin film transistor, a method for fabricating the same, a method for driving the same, and a display device. The thin film transistor includes a gate pattern, a gate insulation layer, an active layer pattern, a source/drain pattern, and a passivation layer. The active layer pattern is made of a carbon nanotube material, and the passivation layer is made of a charge-resistant material capable of reducing mobile charges on a surface of the carbon nanotube material.

20 Claims, 10 Drawing Sheets

(56) References Cited

U.S. PATENT DOCUMENTS

2015/0287942 A1* 10/2015 Cao .................... H01L 51/0541
                                                                        257/347

FOREIGN PATENT DOCUMENTS

| | | |
|---|---|---|
| CN | 103972296 A | 8/2014 |
| CN | 106328592 A | 1/2017 |
| CN | 107039462 A | 8/2017 |

* cited by examiner

THIN FILM TRANSISTOR, FABRICATING METHOD AND DRIVING METHOD THEREOF, AND DISPLAY DEVICE

CROSS-REFERENCE TO RELATED APPLICATION

This application claims priority to Chinese Patent Application No. 201710818794.6, filed on Sep. 12, 2017, the contents of which are incorporated herein by reference in the entirety.

TECHNICAL FIELD

The present invention relates to the field of display technologies, and particularly to a thin film transistor, a method for fabricating the same, a method for driving the same, and a display device.

BACKGROUND

With the development of display technologies, various products with display functions, such as mobile phones, tablet computers, televisions, laptops, digital photo frames, and navigators, have appeared in daily life. These products are all required to be provided with a display panel.

At present, most display panels may include an array substrate, a color filter substrate, and a liquid crystal layer between the array substrate and the color filter substrate. The array substrate includes a base substrate and a plurality of thin film transistors (TFTs) arranged in an array on the base substrate. Since carbon nanotube material has semiconducting properties, and its mobility of carriers is high and its thickness is thin, electrical performance of a TFT can be improved when an active layer of the TFT is made of the carbon nanotube material.

However, when the active layer of the TFT is made of the carbon nanotube material, charges on a surface of the carbon nanotube material may be mixed with water molecules and oxygen molecules in the air, which may cause a severe hysteresis in the TFT.

SUMMARY

In a first aspect, the present application provides a thin film transistor including a gate pattern, a gate insulation layer, an active layer pattern, a source/drain pattern, and a passivation layer. The active layer pattern is made of a carbon nanotube material, and the passivation layer is made of a charge-resistant material capable of reducing mobile charges on a surface of the carbon nanotube material.

In some embodiments, the gate pattern includes a first gate electrode and a second gate electrode arranged in one layer and electrically insulated from each other. The gate insulation layer includes a first gate insulation layer and a second gate insulation layer arranged in one layer. The active layer pattern includes a first active layer and a second active layer arranged in one layer and electrically insulated from each other. The source/drain pattern includes a first source/drain pattern and a second source/drain pattern arranged in one layer, the first source/drain pattern includes a first source electrode and a first drain electrode arranged in one layer and electrically insulated from each other, the second source/drain pattern includes a second source electrode and a second drain electrode arranged in one layer and electrically insulated from each other, and one of the first source electrode and the first drain electrode is electrically connected to one of the second source electrode and the second drain electrode. The first gate electrode, the first gate insulation layer, the first active layer, the first source/drain pattern and the passivation layer constitute a first sub TFT, and the second gate electrode, the second gate insulation layer, the second active layer, the second source/drain pattern and the passivation layer constitute a second sub TFT.

In some embodiments, a gap is provided between the first gate electrode and the second gate electrode to electrically insulate and separate the first gate electrode and the second gate electrode from each other, and a gap is provided between the first active layer and the second active layer to electrically insulate and separate the first active layer and the second active layer from each other.

In some embodiments, the gap between the first active layer and the second active layer is provided with a first filling medium made of an electrically-insulating and transparent material.

In some embodiments, the first filling medium is made of silicon dioxide or silicon nitride.

In some embodiments, the gate pattern, the gate insulation layer, the active layer pattern, the source/drain pattern and the passivation layer are stacked sequentially, and the passivation layer is at a side of the active layer pattern and the source/drain pattern distal to the gate insulation layer and covers the active layer pattern and the source/drain pattern.

In some embodiments, the active layer pattern, the gate insulation layer and the gate pattern are stacked sequentially, the source/drain pattern is at a side of the active layer pattern proximal to the gate insulation layer, an orthographic projection of the source/drain pattern on the active layer pattern is substantially non-overlapping with an orthographic projection of the gate insulation layer and the gate pattern on the active layer pattern, and the passivation layer is at a side of the gate insulation layer and the gate pattern distal to the active layer pattern and covers the gate insulation layer and the gate pattern.

In some embodiments, the active layer pattern is provided with a via penetrating therethrough. The via is between separate portions of the source/drain pattern, and filled with a second filling medium made of a material having such a mobility that only one type of carriers are allowed to pass through.

In some embodiments, the second filling medium is made of indium gallium zinc oxide, indium zinc oxide, low-temperature polysilicon, or molybdenum disulfide.

In some embodiments, the passivation layer is made of aluminum oxide.

In some embodiments, the gate pattern, the gate insulation layer, the active layer pattern, the source/drain pattern and the passivation layer are stacked sequentially, and the passivation layer is at a side of the active layer pattern and the source/drain pattern distal to the gate insulation layer and covers the active layer pattern and the source/drain pattern.

In some embodiments, the active layer pattern, the gate insulation layer and the gate pattern are stacked sequentially, the source/drain pattern is at a side of the active layer pattern proximal to the gate insulation layer, an orthographic projection of the source/drain pattern on the active layer pattern is substantially non-overlapping with an orthographic projection of the gate insulation layer and the gate pattern on the active layer pattern, the passivation layer is at a side of the gate insulation layer and the gate pattern distal to the active layer pattern and covers the gate insulation layer and the gate pattern, and the gate insulation layer completely covers the via.

In a second aspect, there is provided a method for fabricating a TFT, including: forming a gate pattern, a gate insulation layer, an active layer pattern, a source/drain pattern and a passivation layer on a base substrate. The active layer pattern is made of a carbon nanotube material, and the passivation layer is made of a charge-resistant material capable of reducing mobile charges on a surface of the carbon nanotube material.

In some embodiments, the gate pattern is formed to include a first gate electrode and a second gate electrode formed in one patterning process and electrically insulated from each other. The gate insulation layer is formed to include a first gate insulation layer and a second gate insulation layer formed in one patterning process. The active layer pattern is formed to include a first active layer and a second active layer formed in one patterning process and electrically insulated from each other. The source/drain pattern is formed to include a first source/drain pattern and a second source/drain pattern formed in one patterning process, the first source/drain pattern includes a first source electrode and a first drain electrode formed in one patterning process and electrically insulated from each other, the second source/drain pattern includes a second source electrode and a second drain electrode formed in one patterning process and electrically insulated from each other, and one of the first source electrode and the first drain electrode is electrically connected to one of the second source electrode and the second drain electrode. The first gate electrode, the first gate insulation layer, the first active layer, the first source/drain pattern and the passivation layer form a first sub TFT, and the second gate electrode, the second gate insulation layer, the second active layer, the second source/drain pattern and the passivation layer form a second sub TFT.

In some embodiments, a gap is formed between the first gate electrode and the second gate electrode to electrically insulate and separate the first gate electrode and the second gate electrode from each other, and a gap is formed between the first active layer and the second active layer to electrically insulate and separate the first active layer and the second active layer from each other. The method further includes forming a first filling medium in the gap between the first active layer and the second active layer, and the first filling medium is made of an electrically-insulating and transparent material.

In some embodiments, the method further includes: forming, in the active layer pattern, a via penetrating through the active layer pattern, the via being between separate portions of the source/drain pattern; and filling a second filling medium in the via, the second filling medium being made of a material having such a mobility that only one type of carriers are allowed to pass through.

In some embodiments, the step of forming the gate pattern, the gate insulation layer, the active layer pattern, the source/drain pattern and the passivation layer on the base substrate includes: forming the gate pattern on the base substrate; forming the gate insulation layer at a side of the gate pattern distal to the base substrate; forming the active layer pattern at a side of the gate insulation layer distal to the gate pattern; forming the source/drain pattern at a side of the active layer pattern distal to the gate insulation layer; and forming the passivation layer at a side of the active layer pattern and the source/drain pattern distal to the gate insulation layer, the passivation layer being formed to cover the active layer pattern and the source/drain pattern.

In some embodiments, the step of forming the gate pattern, the gate insulation layer, the active layer pattern, the source/drain pattern and the passivation layer on the base substrate includes: forming the active layer pattern on the base substrate; forming the gate insulation layer at a side of the active layer pattern distal to the base substrate; forming the gate pattern at a side of the gate insulation layer distal to the active layer pattern; forming the passivation layer at a side of the gate pattern distal to the active layer pattern; and forming the source/drain pattern at a side of the active layer pattern proximal to the gate insulation layer, wherein an orthographic projection of the source/drain pattern on the active layer pattern is substantially non-overlapping with an orthographic projection of the gate insulation layer and the gate pattern on the active layer pattern.

In a third aspect, there is provided a method for driving a TFT. The TFT includes a gate pattern, a gate insulation layer, an active layer pattern, a source/drain pattern, and a passivation layer; the active layer pattern is made of a carbon nanotube material, and the passivation layer is made of a charge-resistant material capable of reducing mobile charges on a surface of the carbon nanotube material; the gate pattern includes a first gate electrode and a second gate electrode arranged in one layer and electrically insulated from each other; the gate insulation layer includes a first gate insulation layer and a second gate insulation layer arranged in one layer; the active layer pattern includes a first active layer and a second active layer arranged in one layer and electrically insulated from each other; the source/drain pattern includes a first source/drain pattern and a second source/drain pattern arranged in one layer, the first source/drain pattern includes a first source electrode and a first drain electrode arranged in one layer and electrically insulated from each other, the second source/drain pattern includes a second source electrode and a second drain electrode arranged in one layer and electrically insulated from each other, and one of the first source electrode and the first drain electrode is electrically connected to one of the second source electrode and the second drain electrode; the first gate electrode, the first gate insulation layer, the first active layer, the first source/drain pattern and the passivation layer constitute a first sub TFT, and the second gate electrode, the second gate insulation layer, the second active layer, the second source/drain pattern and the passivation layer constitute a second sub TFT. The method includes: applying voltages having a same polarity to the first gate electrode and the second gate electrode, respectively, such that the TFT is in an on state; and applying voltages having different polarities to the first gate electrode and the second gate electrode, respectively, such that the TFT is in an off state.

In a fourth aspect, there is provided a display device including an array substrate, wherein the array substrate includes any one of the TFTs in the first aspect.

BRIEF DESCRIPTION OF DRAWINGS

To explain technical solutions in the embodiments of the present disclosure more clearly, the drawings required in the description of the embodiments will be briefly described below. It is apparent that the drawings in the following description are merely some embodiments of the present disclosure, and for those of ordinary skill in the art, other drawings may also be obtained based on these drawings without any inventive efforts.

DETAILED DESCRIPTION

To make the objects, technical solutions and advantages of the present disclosure clearer, embodiments of the present disclosure will be further described in detail below in conjunction with the accompanying drawings.

Herein, the term "arranged in one layer" refers to being formed by a same patterning process and using a same mask. In some embodiments, the term "arranged in one layer" may further refer to being arranged at one level.

Figure 1:
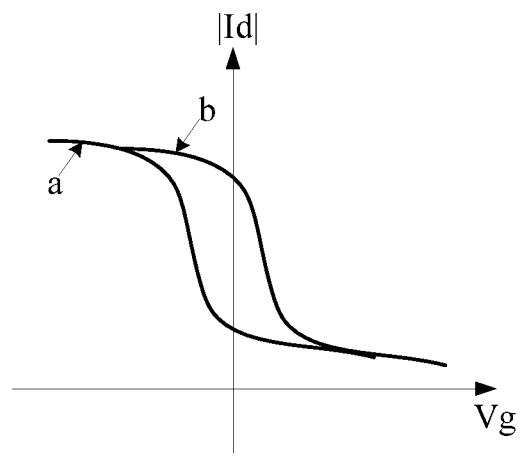
FIG. 1 is a graph illustrating a transfer characteristic curve that shows a hysteresis occurring in a conventional TFT having a carbon nanotube material.

FIG. 1 is a graph illustrating a transfer characteristic curve that shows a hysteresis in a conventional TFT having a carbon nanotube material, in FIG. 1, the horizontal axis indicates a voltage Vg applied to a gate electrode of the TFT, and the vertical axis indicates an absolute value |Id| of a current flowing between a source electrode and a drain electrode of the TFT after the voltage is applied to the gate electrode. When the gate electrode undergoes a forward scan (that is, when the voltage applied to the gate electrode gradually increases from a negative voltage to a positive voltage), the relationship between the voltage applied to the gate and the absolute value of the current flowing between the source electrode and the drain electrode is illustrated as curve "a" shown in FIG. 1. When the gate electrode undergoes a reverse scan (that is, when the voltage applied to the gate electrode gradually decreases from a positive voltage to a negative voltage), the relationship between the voltage applied to the gate and the absolute value of the current flowing between the source electrode and the drain electrode is illustrated as curve "b" shown in FIG. 1. Curve "b" does not coincide with curve "a", and it thus shows that hysteresis occurs in the TFT.

In existing technologies, when the TFT is encapsulated with a passivation layer, charges on a surface of the carbon nanotube material may be prevented from being mixed with water molecules and oxygen molecules in the air; however, the surface of the carbon nanotube material reacts with the water molecules and the oxygen molecules in the air before the TFT is encapsulated, so that hydroxyl groups are formed at the surface of the carbon nanotube material. The hydroxyl groups are capable of capturing free charges, which results in large amount of mobile charges on the surface of the carbon nanotube material. Even after the TFT is encapsulated using the passivation layer, severe hysteresis occurs in the TFT due to the large amount of mobile charges on the surface of the carbon nanotube material.

Figure 2:
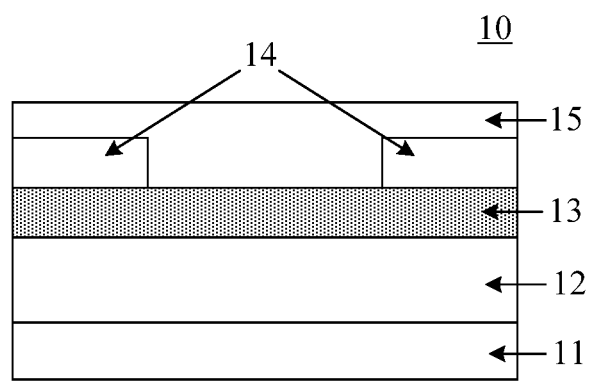
FIG. 2 is a schematic diagram illustrating a structure of a TFT according to an embodiment of the present disclosure.

Embodiments of the present disclosure provide a TFT that obviates at least the above problem. Referring to FIG. 2, a TFT 10 according to an embodiment of the present disclosure may include a gate pattern 11, a gate insulation layer 12, an active layer pattern 13, a source/drain pattern 14, and a passivation layer 15.

The active layer pattern 13 is made of a carbon nanotube material, and the passivation layer 15 is made of a charge-resistant material, which may react with hydroxyl groups on a surface of the carbon nanotube material to reduce the hydroxyl groups on the surface of the carbon nanotube material, thereby reducing the mobile charges on the surface of the carbon nanotube material.

In summary, in the TFT according to the embodiments of the present disclosure, the passivation layer prevents the charges on the surface of the carbon nanotube material from being mixed with water molecules and oxygen molecules in the air, and is made of the charge-resistant material, and thus the mobile charges on the surface of the carbon nanotube material can be reduced, thereby reducing possibility of hysteresis in the TFT.

In some embodiments, the passivation layer may be made of aluminum oxide, of which aluminum atoms can react with the hydroxyl groups on the surface of the carbon nanotube material to reduce the mobile charges on the surface of the carbon nanotube material, thereby eliminating the hysteresis in the TFT.

Figure 3:
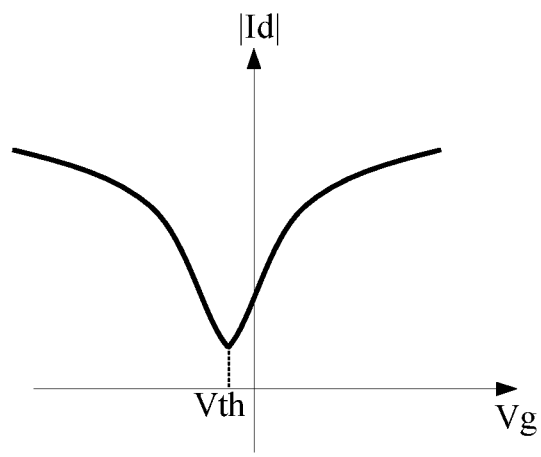
FIG. 3 is a graph illustrating a transfer characteristic curve that shows an ambipolar conduction occurring in a conventional TFT having a carbon nanotube material.

In existing technologies, in a case where the active layer is made of a material including a carbon nanotube material, ambipolar conduction may occurs in carries in the active layer. FIG. 3 is a graph illustrating a transfer characteristic curve that shows an ambipolar conduction in a conventional TFT having a carbon nanotube material, in FIG. 3, the horizontal axis indicates a voltage Vg applied to a gate electrode of the TFT, and the vertical axis indicates absolute value |Id| of a current flowing between a source electrode and a drain electrode of the TFT after the voltage is applied to the gate electrode. In a case where the voltage applied to the gate electrode is a negative voltage less than the threshold voltage Vth and having a large absolute value, the carries in the active layer are holes, the current flowing between the source electrode and the drain electrode of the TFT is large, and at this time, the TFT is in an on state. In a case where the voltage applied to the gate electrode is close to the threshold voltage Vth, the current flowing between the source electrode and the drain electrode of the TFT is small (e.g., nearly zero), and at this time, the TFT is in an off state. In a case where the voltage applied to the gate electrode is a positive voltage exceeding the threshold voltage Vth and having a large value, the carriers in the active layer are electrons, the current flowing between the source electrode and the drain electrode of the TFT is large, and at this time, the TFT is in the on state. Therefore, in the existing technologies, in order to turn off the TFT, the voltage applied to the gate electrode must be close to the threshold voltage Vth, and thus a range of voltage within which the TFT is in the off state is small, resulting in that the TFT according to existing technologies cannot serve as a switch.

A TFT according to embodiments of the present disclosure can obviate the ambipolar conduction in the TFT in existing technologies, and achieve unipolar conduction, and thus can serve as a switch. In the embodiments of the present disclosure, two structures capable of achieving unipolar conduction are illustratively described as examples. It should be noted that the TFT in the following description may have the characteristics described above, for example, the active layer is made of a carbon nanotube material, the passivation layer is made of a charge-resistant material, and the like.

In a first structure capable of achieving unipolar conduction, the unipolar conduction is realized by a dual-gate TFT.

Figure 4:
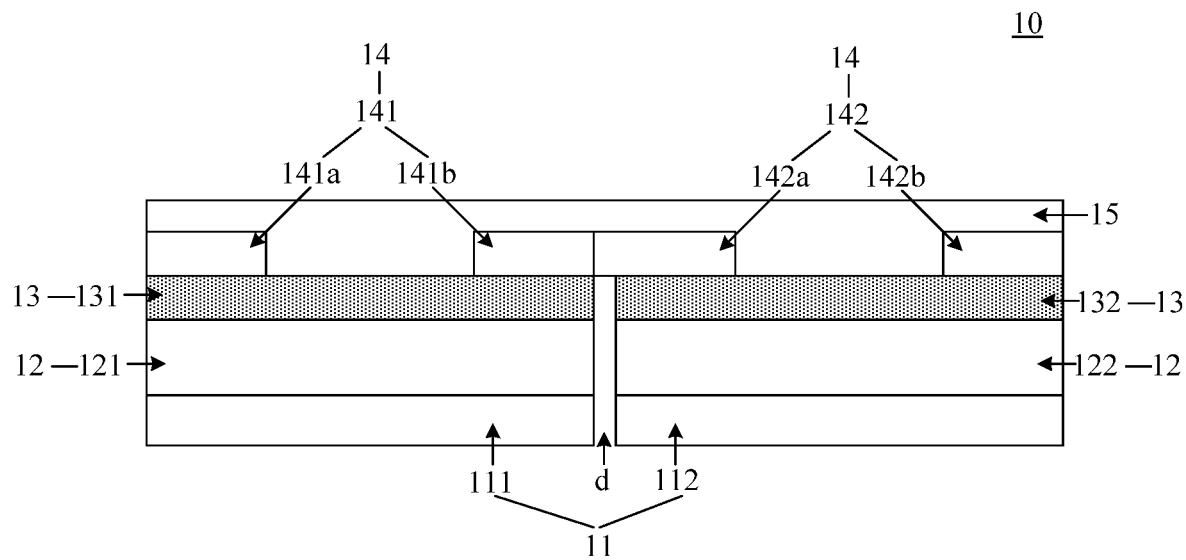
FIG. 4 is a schematic diagram illustrating a structure of another TFT according to an embodiment of the present disclosure.

Referring to FIG. 4, which illustrates a structure of another TFT 10 according to an embodiment of the present disclosure, the gate pattern 11, the gate insulation layer 12, the active layer pattern 13, the source/drain pattern 14 and the passivation layer 15 are stacked sequentially in the TFT 10. The gate pattern 11 may include a first gate electrode 111 and a second gate electrode 112 arranged in one layer and electrically insulated from each other. The gate insulation layer 12 may include a first gate insulation layer 121 and a second gate insulation layer 122 arranged in one layer. The active layer pattern 13 may include a first active layer 131 and a second active layer 132 arranged in one layer and electrically insulated from each other. The source/drain pattern 14 may include a first source/drain pattern 141 and a second source/drain pattern 142 arranged in one layer, the first source/drain pattern 141 may include a first source electrode 141a and a first drain electrode 141b arranged in one layer and electrically insulated from each other, and the second source/drain pattern 142 may include a second source electrode 142a and a second drain electrode 142b arranged in one layer and electrically insulated from each other. The passivation layer 15 is disposed at a side of the first and second active layers 131 and 132 and the first and second source/drain patterns 141 and 142 distal to the gate insulation layer 12, and covers the first and second active layers 131 and 132 and the first and second source/drain patterns 141 and 142. FIG. 4 illustrates a case where the first drain electrode 141b is electrically connected to the second source electrode 142a as an example, but the present disclosure is not limited thereto, as long as one of the first source electrode and the first drain electrode is electrically connected to one of the second source electrode and the second drain electrode.

In some embodiments, referring to FIG. 4, a gap d may be provided between the first gate electrode 111 and the second gate electrode 112 to electrically insulate and separate the first gate electrode and the second gate electrode from each other, a gap d may be provided between the first active layer 131 and the second active layer 132 to electrically insulate and separate the first active layer and the second active layer from each other, and a gap d may be provided between the first gate insulation layer 121 and the second gate insulation layer 122. FIG. 4 illustrates a case where a gap d is provided between the first gate insulation layer 121 and the second gate insulation layer 122 as an example; however, in practice applications, it is possible that there is no gap between the first gate insulation layer 121 and the second gate insulation layer 122, and in this case, the first gate insulation layer 121 and the second gate insulation layer 122 are formed to be an integral layer.

In some embodiments, the gap d between the first active layer and the second active layer is provided with a first filling medium, which may be made of an electrically-insulating and transparent material. In practice applications, the first filling medium may be made of the same material as that of the gate insulation layer. In some embodiments, the first filling medium may be made of silicon dioxide or silicon nitride.

Figure 5A:
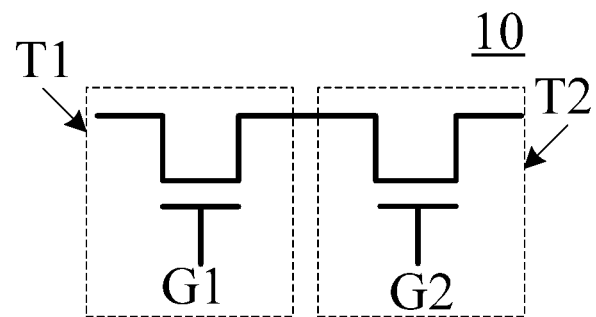
FIG. 5A is an equivalent circuit diagram of a TFT according to an embodiment of the present disclosure.

In embodiments of the present disclosure, referring to FIG. 5A, the TFT may include two sub TFTs, namely, a first sub TFT T1 and a second sub TFT T2. The first sub TFT T1 may include the first gate electrode 111, the first gate insulation layer 121, the first active layer 131, the first source/drain pattern 141 and the passivation layer 15 stacked sequentially, as illustrated in FIG. 4. The second sub TFT T2 may include the second gate electrode 112, the second gate insulation layer 122, the second active layer 132, the second source/drain pattern 142 and the passivation layer 15 stacked sequentially, as illustrated in FIG. 4.

Figure 5B:
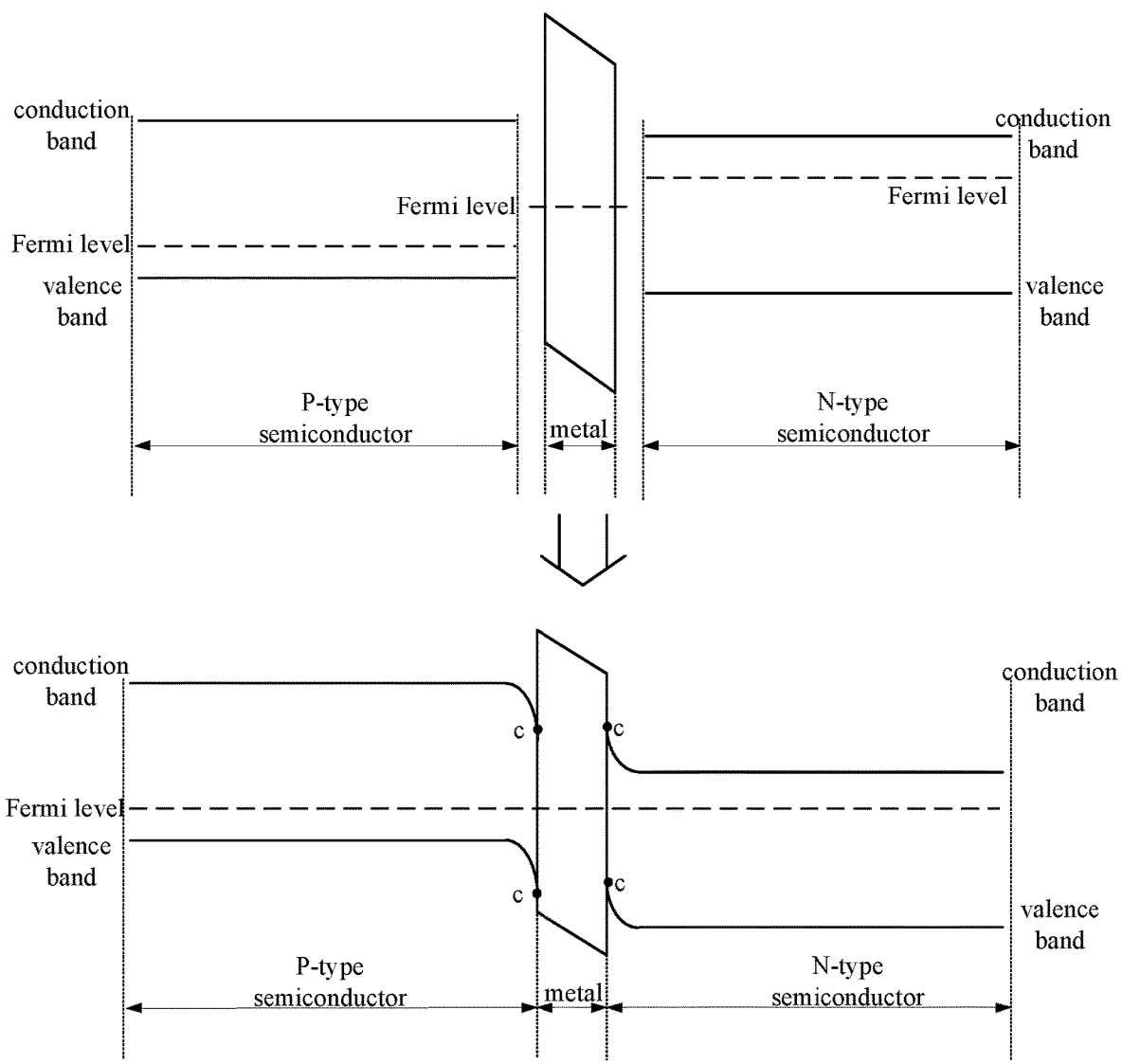
FIG. 5B is a schematic diagram illustrating a band structure before and after a metal contacts a semiconductor, according to existing technologies.
Figure 5C:
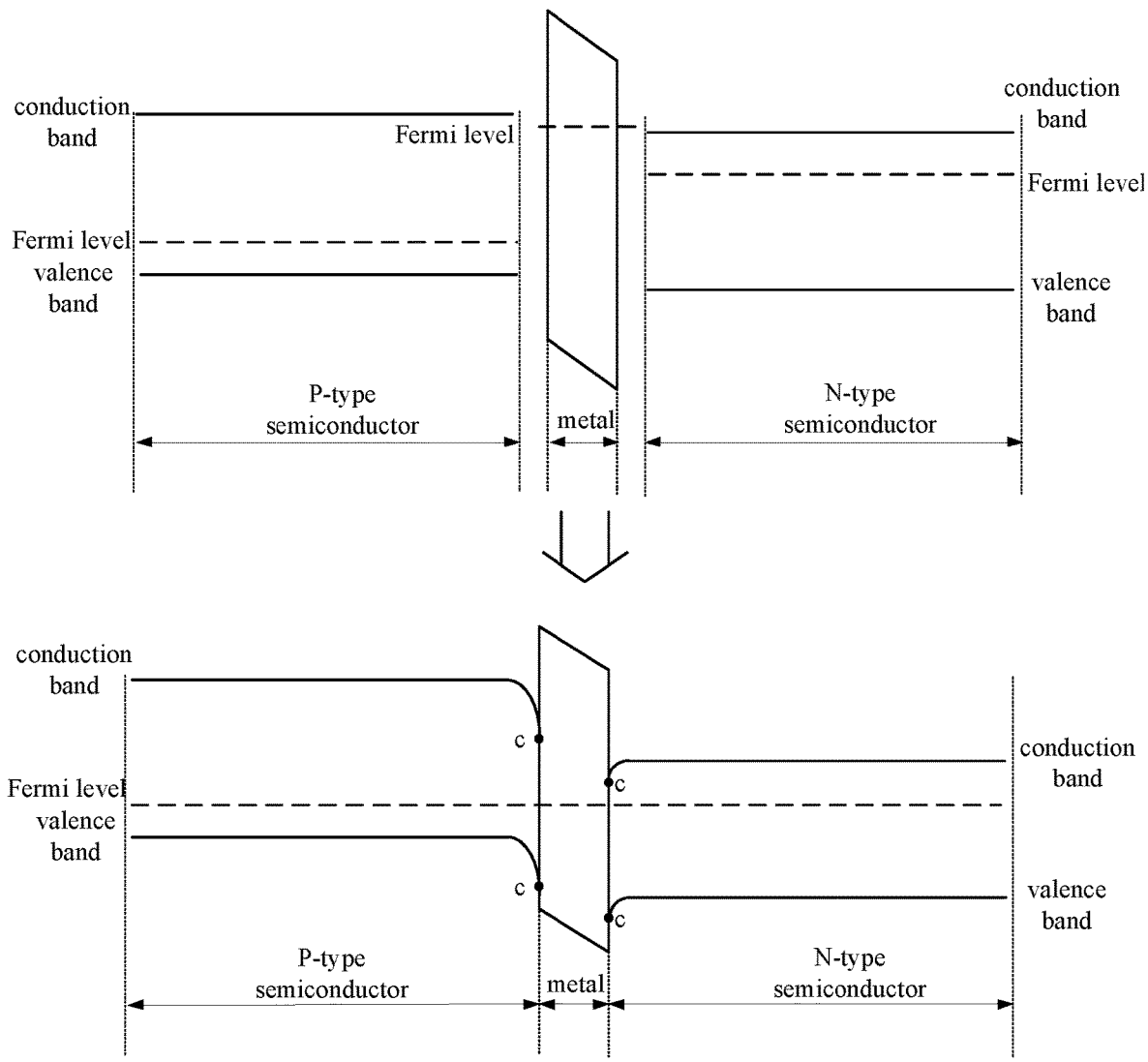
FIG. 5C is a schematic diagram illustrating another band structure before and after a metal contacts a semiconductor, according to existing technologies.
Figure 5D:
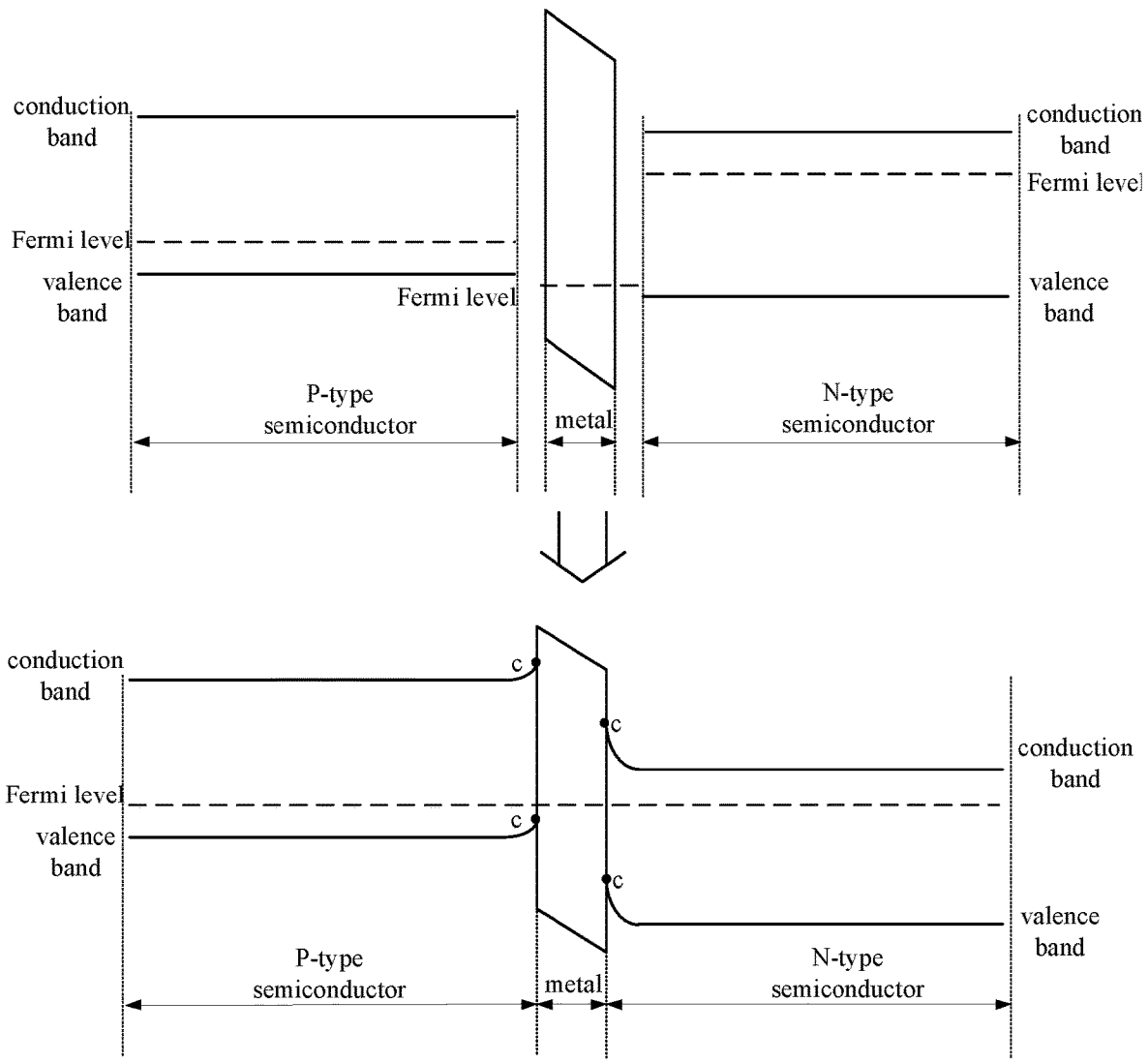
FIG. 5D is a schematic diagram illustrating still another band structure before and after a metal contacts a semiconductor, according to existing technologies.

FIGS. 5B to 5D are schematic diagrams illustrating a band structure of a metal before and after the metal contacts a semiconductor in three conditions, according to existing technologies. In each of the three conditions, relationship of the energy band of the metal and the energy band of the semiconductor is different, and each of the n-type and the p-type semiconductors in FIGS. 5B to 5D is made of the carbon nanotube material. In existing technologies, when the voltage applied to the gate electrode is a negative voltage less than the threshold voltage Vth and having a large absolute value, the energy band when the metal is in contact with the semiconductor is changed from the situation illustrated in FIGS. 5B to 5D. Specifically, the conduction band and the valence band in the band structure shown in FIGS. 5B to 5D both move upward, resulting in an increase in a potential barrier blocking electrons from passing through and formed when the carbon nanotube material contacts the metal and a decrease in a potential barrier blocking holes from passing through and formed when the carbon nanotube material contacts the metal. Due to a small band gap (i.e., a small difference between the lowest energy level of the conduction band and the highest energy level of the valence band) of the carbon nanotube material in the TFT, the holes in the carbon nanotube material can pass through the active region of the TFT to form an on current, and in this case, the TFT is in the on state. When the voltage applied to the gate electrode is a positive voltage exceeding the threshold voltage Vth and having a large value, the energy band when the metal is in contact with the semiconductor is changed. Specifically, the conduction band and the valence band in the band structure shown in FIGS. 5B to 5D both move downward, resulting in an increase in a potential barrier blocking holes from passing through and formed when the carbon nanotube material contacts the metal and a decrease in a potential barrier blocking electrons from passing through and formed when the carbon nanotube material contacts the metal. Due to a small band gap of the carbon nanotube material in the TFT, the electrons in the carbon nanotube material can pass through the active region of the TFT to form an on current, and in this case, the TFT is in the on state.

In practice applications, in a case where the TFT includes the first and second sub TFTs T1 and T2 as illustrated in FIG. 5A, voltages applied to the first gate electrode G1 of the first sub TFT T1 and the second gate electrode G2 of the second sub TFT T2 may be controlled separately, so that the TFT has a unipolar conduction characteristic.

Figure 5E:
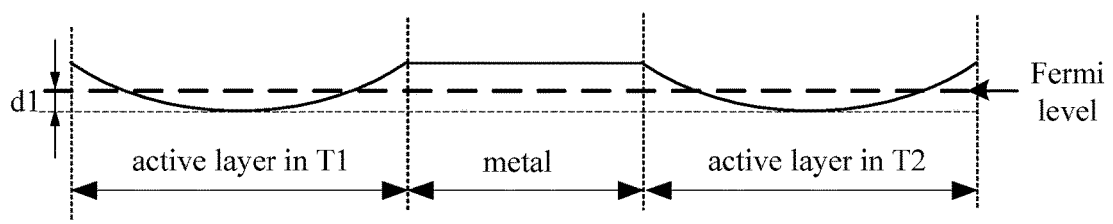
FIG. 5E is a schematic diagram illustrating that a potential barrier for blocking holes from passing through is formed in a TFT when first and second gate electrodes of the TFT are loaded with voltages having a same polarity, respectively, according to an embodiment of the present disclosure.

Specifically, when the first gate electrode G1 and the second gate electrode G2 are loaded with voltages having a same polarity (for example, the voltages applied to the first gate electrode G1 and the second gate electrode G2 each are negative voltages less than the threshold voltage and having large absolute values), referring to FIG. 5E, a potential barrier d1 blocking holes from passing through and formed by the contact of the metal (i.e., the first drain electrode 141b and the second source electrode 142a electrically connected with each other in FIG. 4) with the active layer (i.e., the carbon nanotube material in the TFT) at both sides of the metal is small, and thus the carriers in the active layer easily pass through the whole TFT 10, so the TFT 10 is in the on state.

Figure 5F:
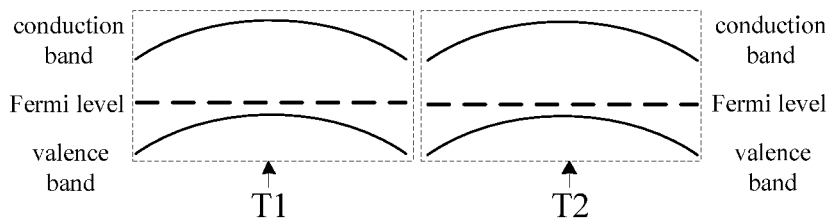
FIG. 5F is a schematic diagram illustrating a band structure of an active layer of an TFT according to an embodiment of the present disclosure.

In some embodiments, referring to FIG. 5F, the valence band of the active layer of the first sub TFT T1 is near Fermi level, and the valence band of the active layer of the second sub TFT T2 is near Fermi level. In this case, both of the carriers in the active layer of the first sub TFT T1 and the carriers in the active layer of the second sub TFT T2 are holes and can easily pass through the whole TFT 10, so the TFT 10 is in the on state.

Figure 5G:
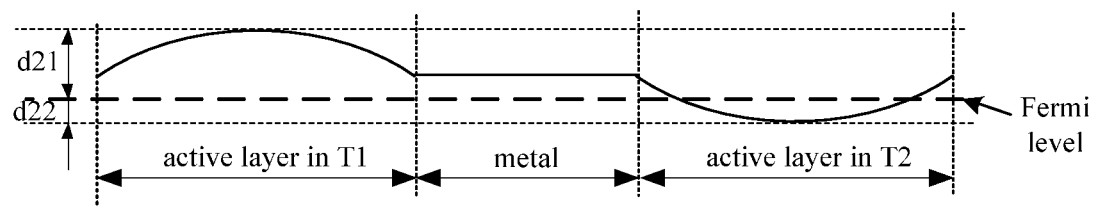
FIG. 5G is a schematic diagram illustrating that a potential barrier for blocking holes from passing through is formed in a TFT when the first and second gate electrodes of the TFT are loaded with voltages having different polarities, respectively, according to an embodiment of the present disclosure.

When the first gate electrode G1 and the second gate electrode G2 are loaded with voltages having different polarities, respectively (e.g., the voltage applied to the first gate electrode G1 is a positive voltage exceeding the threshold voltage and having a large value while the voltage applied to the second gate electrode G2 is a negative voltage whose polarity is opposite to that of the voltage applied to the first gate electrode G1; alternatively, the voltage applied to the second gate electrode G2 is a positive voltage exceeding the threshold voltage and having a large value while the voltage applied to the first gate electrode G1 is a negative voltage whose polarity is opposite to that of the voltage applied to the second gate electrode G2), by taking a case where the voltage applied to the first gate electrode G1 is a positive voltage exceeding the threshold voltage and having a large value while the voltage applied to the second gate electrode G2 is a negative voltage whose polarity is opposite to that of the voltage applied to the first gate electrode G1 as an example and referring to FIG. 5G, although the Fermi level of the active layer of the first sub TFT T1 is equal to the Fermi level of the active layer of the second sub TFT T2, the potential barrier formed by the contact of the metal with the active layer at both sides of the metal in each of the first and second sub TFTs T1 and T2 has a different magnitude. Specifically, a potential barrier d21 blocking holes from passing through and formed by the contact of the active layer with the metal in the first sub TFT T1 is large, and accordingly a potential barrier blocking electrons from passing through and formed by the contact of the active layer with the metal in the first sub TFT T1 is small; a potential barrier d22 blocking holes from passing through and formed by the contact of the active layer with the metal in the second sub TFT T2 is small, and accordingly a potential barrier blocking electrons from passing through and formed by the contact of the active layer with the metal in the second sub TFT T2 is large. In this case, although the electrons in the active layer of the first sub TFT T1 can pass through the first sub TFT T1, they cannot pass through the second sub TFT T2; although the holes in the active layer of the second sub TFT T2 can pass through the second sub TFT T2, they cannot pass through the first sub TFT T1. This makes it difficult for carriers in the active layer to pass through the whole TFT 10, so the TFT 10 is in the off state.

Figure 5H:
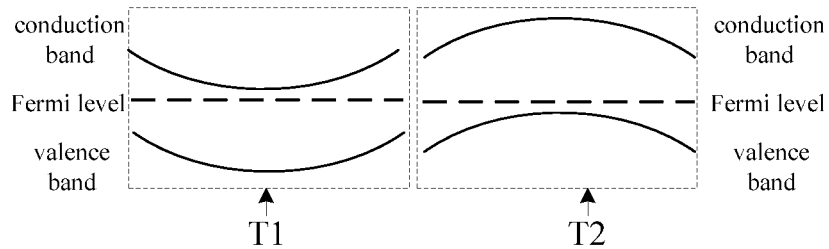
FIG. 5H is a schematic diagram illustrating a band structure of an active layer of another TFT according to an embodiment of the present disclosure.

For example, in a case where the voltage applied to the first gate electrode G1 is a positive voltage exceeding the threshold voltage and having a large value while the voltage applied to the second gate electrode G2 is a negative voltage whose polarity is opposite to that of the voltage applied to the first gate electrode G1, the band structure of the active layer of the TFT is as illustrated in FIG. 5H. The conduction band of the active layer of the first sub TFT T1 is near the Fermi level, the carriers in the active layer of the first sub TFT T1 are electrons, the valence band of the active layer of the second sub TFT T2 is near the Fermi level, and the carriers in the active layer of the second sub TFT T2 are holes. Although the carriers in the first sub TFT T1 can pass through the first sub TFT T1, they cannot pass through the second sub TFT T2 due to the potential barrier formed in the second sub TFT T2; although the carriers in the second sub TFT T2 can pass through the second sub TFT T2, they cannot pass through the first sub TFT T1 due to the potential barrier formed in the first sub TFT T1, and thus the TFT 10 is in the off state.

In a second structure capable of achieving unipolar conduction, the unipolar conduction is realized by providing a filling medium in the active layer pattern.

Figure 6:
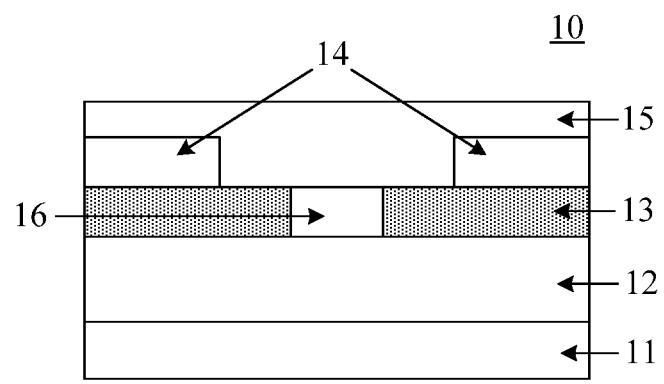
FIG. 6 is a schematic diagram illustrating a structure of another TFT according to an embodiment of the present disclosure.

Referring to FIG. 6 which is a schematic diagram illustrating a structure of another TFT 10 according to an embodiment of the present disclosure, the gate pattern 11, the gate insulation layer 12, the active layer pattern 13, the source/drain pattern 14 and the passivation 15 are stacked sequentially in the TFT 10. The active layer pattern 13 is provided with a via penetrating therethrough. The via is disposed between separate portions of the source/drain pattern, and filled with a second filling medium 16. The second filling medium 16 may be made of a material having high mobility, that is, the mobility of the material is high enough to allow only one type of carriers (i.e., either holes or electrons) to pass through. In some embodiments, the second filling medium 16 may be made of indium gallium zinc oxide, indium zinc oxide, low-temperature polysilicon, or molybdenum disulfide.

In embodiments of the present disclosure, when the second filling medium 16 is made of the material having high mobility, the characteristics of the TFT 10 can be ensured unchanged, that is, good electrical characteristics of the TFT 10 can be ensured. In addition, the second filling medium 16 allows only one type of carriers to pass through, so that the TFT 10 is capable of achieving unipolar conduction. In some embodiments, when the second filling medium 16 is made of an oxide material such as indium gallium zinc oxide or indium zinc oxide, the oxide material allows only holes to pass through. In this case, if the voltage applied to the gate pattern 11 is a negative voltage less than the threshold voltage and having a large absolute value, the carriers in the active layer pattern 13 are holes, which can pass through the second filling medium 16, so that current may be formed in the source/drain pattern 14 to make the TFT 10 in the on state. Otherwise, if the voltage applied to the gate pattern 11 makes that the carriers in the active layer pattern 13 are electrons, the carriers cannot pass through the second filling medium 16, so that no current is formed in the source/drain pattern 14, and in this case, the TFT 10 is in the off state.

Figure 7:
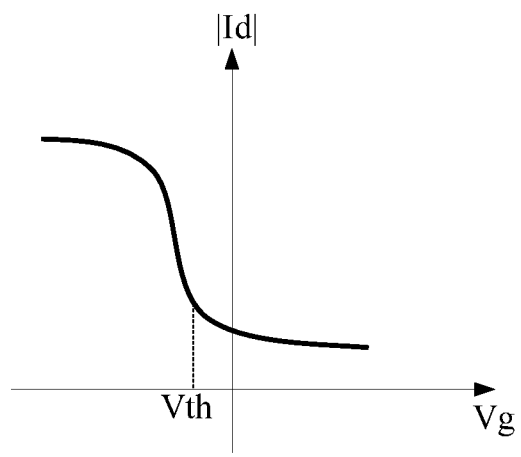
FIG. 7 is a graph illustrating a transfer characteristic curve that shows a unipolar conduction in a TFT according to an embodiment of the present disclosure.

In practice applications, the TFT having any one of the above two structures can realize unipolar conduction. FIG. 7 is a graph illustrating a transfer characteristic curve that shows a unipolar conduction in the TFT according to embodiments of the present disclosure, in FIG. 7, the horizontal axis indicates the voltage Vg applied to a gate electrode of the TFT, and the vertical axis indicates absolute value |Id| of a current flowing between a source electrode and a drain electrode of the TFT after the voltage is applied to the gate electrode. When the voltage applied to the gate electrode is a negative voltage less than the threshold voltage Vth and having a large absolute value, the TFT is in the on state. When the voltage applied to the gate electrode is a positive voltage exceeding the threshold voltage Vth and having a large value, the TFT is in the off state.

It should be noted that the above embodiments are illustratively described by taking a bottom-gate TFT as an example. In practice application, the TFT may also be a top-gate TFT, which is also capable of achieving unipolar conduction and thus can serve as a switch. Accordingly, for the top-gate TFT, two structures are illustratively described as examples in the embodiments of the present disclosure.

In a first structure of the top-gate TFT, the unipolar conduction is realized by a dual-gate TFT.

Figure 8:
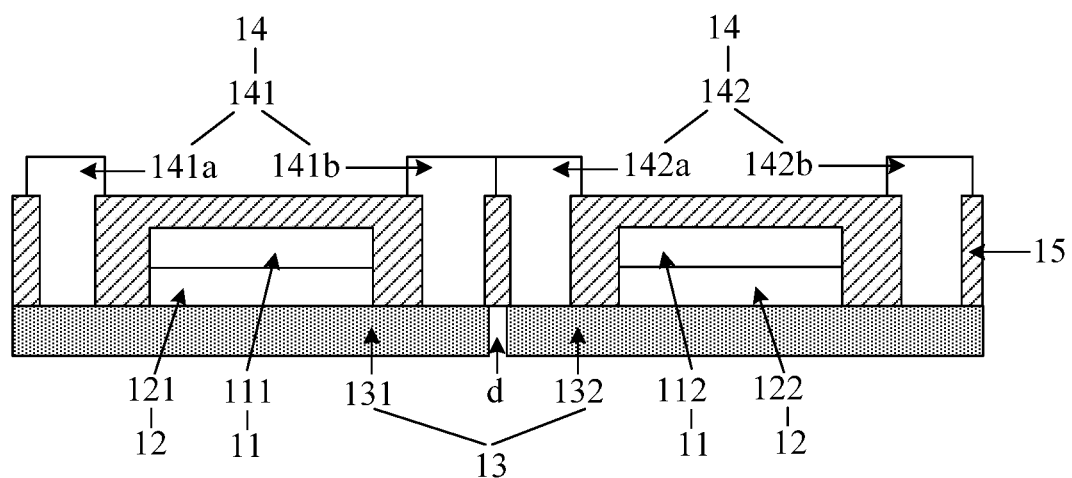
FIG. 8 is a schematic diagram illustrating a structure of a TFT according to another embodiment of the present disclosure.

Referring to FIG. 8 which illustrates a structure of the TFT 10 according to another embodiment of the present disclosure, the active layer pattern 13, the gate insulation layer 12, the gate pattern 11, the passivation layer 15 and the source/drain pattern 14 are stacked sequentially in the TFT 10. The active layer pattern 13 may include a first active layer 131 and a second active layer 132 arranged in one layer and electrically insulated from each other. The gate insulation layer 12 may include a first gate insulation layer 121 and a second gate insulation layer 122 arranged in one layer. The gate pattern 11 may include a first gate electrode 111 and a second gate electrode 112 arranged in one layer and electrically insulated from each other. The source/drain pattern 14 may include a first source/drain pattern 141 and a second source/drain pattern 142 arranged in one layer, the first source/drain pattern 141 may include a first source electrode 141a and a first drain electrode 141b electrically insulated from each other, and the second source/drain pattern 142 may include a second source electrode 142a and a second drain electrode 142b electrically insulated from each other. The first drain electrode 141b is electrically connected to the second source electrode 142a; alternatively, the first source electrode 141a is electrically connected to the second drain electrode 142b. In some embodiments, as illustrated in FIG. 8, the source/drain pattern 14 including the first and second source/drain patterns 141 and 142 is disposed at a side of the first and second active layer 131 and 132 proximal to the first and second gate insulation layers 121 and 122, an orthographic projection of the first source/drain pattern 141 on the first active layer 131 is substantially non-overlapping with an orthographic projection of the first gate insulation layer 121 and the first gate electrode 111 on the first active layer 131, and an orthographic projection of the second source/drain pattern 142 on the second active layer 132 is substantially non-overlapping with an orthographic projection of the second gate insulation layer 122 and the second gate electrode 112 on the second active layer 132. The passivation layer 15 is disposed at a side of the gate insulation layer 12 and the gate pattern 11 distal to the active layer pattern 13 and covers the gate insulation layer and the gate pattern. For example, as illustrated in FIG. 8, the passivation layer 15 covers side surfaces of the gate insulation layer 12 and the gate pattern 11 and an upper surface of the gate pattern 11.

In some embodiments, referring to FIG. 8, in the top-gate TFT, a gap d may be also provided between the first gate insulation layer 121 and the second gate insulation layer 122. In some embodiments, the gate d is provided with a first filling medium, which may be made of an electrically-insulating and transparent material. In practice applications, the first filling medium may be made of the same material as that of the gate insulation layer. In some embodiments, the first filling medium may be made of silicon dioxide or silicon nitride.

In a second structure of the top-gate TFT, the unipolar conduction is realized by providing a filling medium in the active layer pattern.

Figure 9:
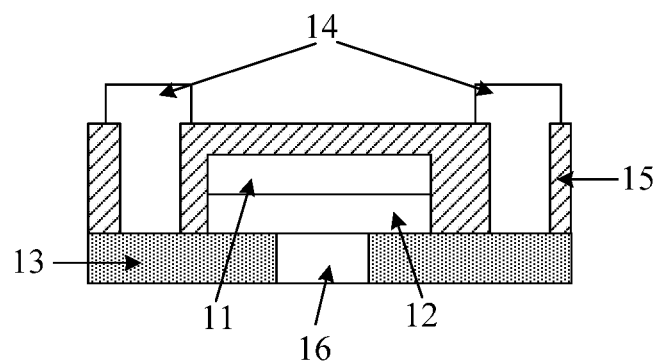
FIG. 9 is a schematic diagram illustrating a structure of another TFT according to another embodiment of the present disclosure.

Referring to FIG. 9, which illustrates another structure of the TFT 10 according to another embodiment of the present disclosure, the active layer pattern 13, the gate insulation layer 12, the gate pattern 11, the passivation layer 15 and the source/drain pattern 14 are stacked sequentially in the TFT 10. The active layer pattern 13 is provided with a via penetrating therethrough. The via is disposed between separate portions of the source/drain pattern, and filled with a second filling medium 16 therein. The second filling medium 16 may be made of a material having high mobility. In some embodiments, the second filling medium 16 may be made of indium gallium zinc oxide, indium zinc oxide, low-temperature polysilicon, or molybdenum disulfide. In some embodiments and as illustrated in FIG. 9, the source/drain pattern 14 is disposed at a side of the active layer pattern 13 proximal to the gate insulation layer 12, and an orthographic projection of the source/drain pattern 14 on the active layer pattern 13 is substantially non-overlapping with an orthographic projection of the gate insulation layer 12 and the gate pattern 11 on the active layer pattern 13. The passivation layer 15 is disposed at a side of the gate insulation layer 12 and the gate pattern 11 distal to the active layer pattern 13 and covers the gate insulation layer 12 and the gate pattern 11, and the gate insulation layer 12 completely covers the via.

It should be noted that the principle for realizing unipolar conduction in the top-gate TFT may be understood with reference to the corresponding description for the bottom-gate TFT, and not repeated in the embodiments of the present disclosure.

In summary, in the TFT according to the embodiments of the present disclosure, the passivation layer prevents the charges on the surface of the carbon nanotube material from being mixed with water molecules and oxygen molecules in the air, and is made of the charge-resistant material, and thus the mobile charges on the surface of the carbon nanotube material can be reduced, thereby reducing possibility of hysteresis in the TFT. In addition, the TFT is capable of achieving unipolar conduction.

Embodiments of the present disclosure further provide a method for driving a TFT, which is applied to the TFT 10 as illustrated in FIG. 4. The method may include: applying voltages having a same polarity to the first gate electrode 121 and the second gate electrode 122, respectively, such that the TFT 10 is in an on state; and applying voltages having different polarities to the first gate electrode 121 and the second gate electrode 122, respectively, such that the TFT 10 is in an off state.

It should be noted that the principle for controlling the TFT 10 to be in on or off state may be understood with reference to the corresponding description for the bottom-gate TFT, and not repeated in the embodiments of the present disclosure.

Embodiments of the present disclosure further provide a method for fabricating a TFT. The method may include: forming a gate pattern, a gate insulation layer, an active layer pattern, a source/drain pattern and a passivation layer on a base substrate. The active layer pattern is made of a carbon nanotube material, and the passivation layer is made of a charge-resistant material for reducing mobile charges on a surface of the carbon nanotube material.

In summary, in the method for fabricating the TFT according to the embodiments of the present disclosure, the passivation layer prevents the charges on the surface of the carbon nanotube material from being mixed with water molecules and oxygen molecules in the air, and is made of the charge-resistant material, which is capable of reducing the mobile charges on the surface of the carbon nanotube material, thereby reducing possibility of hysteresis in the TFT.

In practice applications, since the embodiments of the present disclosure provide various TFT structures capable of achieving unipolar conduction, the method for fabricating the TFT according to the embodiments of the present disclosure may be implemented in various ways. In the embodiments of the present disclosure, the following two ways for implementation of the method are illustratively described as an example.

Figure 10:
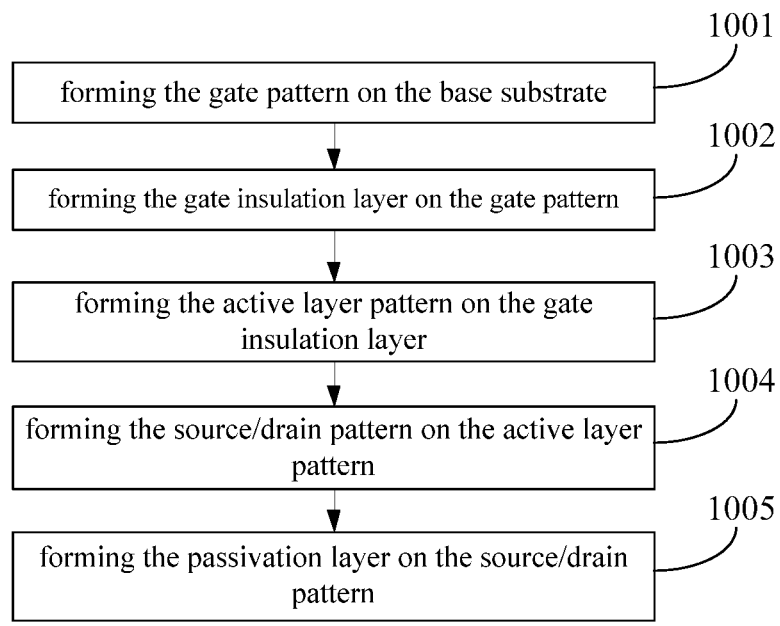
FIG. 10 is a flowchart of a method for fabricating a TFT according to an embodiment of the present disclosure.

In a first way for implementation, the gate pattern, the gate insulation layer, the active layer pattern, the source/drain pattern and the passivation layer in the TFT are formed to be stacked sequentially, and the unipolar conduction is realized by a dual-gate TFT. FIG. 10 is a flowchart of a method for fabricating a TFT according to an embodiment of the present disclosure, and the TFT fabricated by the method may have the structure as illustrated in FIG. 4. Referring to FIG. 10, the method may include steps 1001 to 1005.

In step 1001, the gate pattern is formed on the base substrate. The gate pattern may include a first gate electrode and a second gate electrode electrically insulated from each other.

In some embodiments, in order to form the first gate electrode and the second gate electrode electrically insulated from each other on the base substrate, a gap may be provided between the first gate electrode and the second gate electrode. The gate pattern may be made of a metal material. For example, the gate pattern is made of molybdenum (Mo), copper (Cu), aluminum (Al), or an alloy material.

In some embodiments, a gate metal layer is formed on the base substrate by any one of processes such as deposition, coating, sputtering, and the like, and then the gate pattern is formed by performing one patterning process on the gate metal layer. The one patterning process may include steps of photoresist coating, exposure, developing, etching and photoresist removing.

In the embodiments of the present disclosure, a first filling medium may be provided in the gap, that is, the first filling medium may be provided between the first gate electrode and the second gate electrode. The first filling medium may be made of an electrically-insulating and transparent material. For example, the first filling medium may be made of silicon dioxide or silicon nitride. In some embodiments, the first filling medium may be formed between the first gate electrode and the second gate electrode by a process of evaporation.

In step 1002, the gate insulation layer is formed at a side of the gate pattern distal to the base substrate. The gate insulation layer may include a first gate insulation layer and a second gate insulation layer.

In some embodiments, a gap may be formed between the first gate insulation layer and the second gate insulation layer. Alternatively, the first gate insulation layer and the second gate insulation layer may be formed to be an integral layer. The gate insulation layer may be made of silicon dioxide, silicon nitride, or a mixture of silicon dioxide and silicon nitride.

In some embodiments, in a case where the gap is formed between the first gate insulation layer and the second gate insulation layer, the process of forming the gate insulation layer includes: forming a gate insulation layer film on the base substrate, on which the gate pattern has been formed, by any one of processes such as deposition, coating, spraying, and the like, and forming the gate insulation layer by performing one patterning process on the gate insulation layer film. The one patterning process may include steps of photoresist coating, exposure, developing, etching and photoresist removing. In the embodiments of the present disclosure, the first filling medium may be provided in the gap, that is, the first filling medium may be provided between the first gate insulation layer and the second gate insulation layer. The first filling medium may be made of an electrically-insulating and transparent material. For example, the first filling medium may be made of silicon dioxide or silicon nitride. In some embodiments, the first filling medium may be formed between the first gate insulation layer and the second gate insulation layer by a process of evaporation.

In some embodiments, in a case where the first and second gate insulation layers are formed to be an integral layer, the gate insulation layer may be formed on the base substrate, on which the gate pattern has been formed, by any one of processes such as deposition, coating, spraying, and the like.

In step 1003, the active layer pattern is formed at a side of the gate insulation layer distal to the gate pattern. The active layer pattern may include a first active layer and a second active layer electrically insulated from each other.

In some embodiments, in order to form the first active layer and the second active layer electrically insulated from each other on the gate insulation layer, a gap may be provided between the first active layer and the second active layer. The active layer pattern may be made of a carbon nanotube material.

In some embodiments, an active layer film is formed on the base substrate, on which the gate insulation layer has been formed, by any one of processes such as deposition, coating, spraying, and the like, and then the active layer pattern is formed by performing one patterning process on the active layer film. The one patterning process may include steps of photoresist coating, exposure, developing, etching and photoresist removing.

In some embodiments, the first filling medium may be provided in the gap, that is, the first filling medium may be provided between the first active layer and the second active layer. The first filling medium may be made of an electrically-insulating and transparent material. For example, the first filling medium may be made of silicon dioxide or silicon nitride. In some embodiments, the first filling medium may be formed between the first active layer and the second active layer by a process of evaporation.

In step 1004, the source/drain pattern is formed at a side of the active layer pattern distal to the gate insulation layer. The source/drain pattern may include a first source/drain pattern and a second source/drain pattern.

In some embodiments, the first source/drain pattern includes a first source electrode and a first drain electrode electrically insulated from each other, and the second source/drain pattern includes a second source electrode and a second drain electrode electrically insulated from each other. The first drain electrode is electrically connected to the second source electrode; alternatively, the first source electrode is electrically connected to the second drain electrode. The source/drain pattern may be made of Mo, Cu, Al, or an alloy material.

In some embodiments, a source/drain film is formed on the base substrate, on which the active layer pattern has been formed, by any one of processes such as deposition, coating, sputtering, and the like, and then the source/drain pattern is formed by performing one patterning process on the source/drain film. The one patterning process may include steps of photoresist coating, exposure, developing, etching and photoresist removing.

In step 1005, the passivation layer is formed at a side of the active layer pattern and the source/drain pattern distal to the gate insulation layer.

In some embodiments, the passivation layer is made of a charge-resistant material. For example, the passivation layer may be made of aluminum oxide. In some embodiments, the passivation layer is formed on the base substrate, on which the source/drain pattern has been formed, by any one of processes such as deposition, coating, spraying, and the like. The passivation layer may be formed to cover the active layer pattern and the source/drain pattern.

In the TFT formed by the steps 1001 to 1005, the first gate electrode, the first gate insulation layer, the first active layer, the first source/drain pattern, and the passivation layer are stacked sequentially, and the second gate electrode, the second gate insulation layer, the second active layer, and the second source/drain pattern, and the passivation layer are stacked sequentially.

It should be noted that, in a case where gaps are provided between the first gate electrode and the second gate electrode, between the first active layer and the second active layer, and between the first gate insulation layer and the second gate insulation layer, respectively, the first filling medium is formed in the gaps by a process of evaporation after the step 1004. In this case, the first filling medium may be formed in the gaps by only one process of evaporation.

Figure 11:
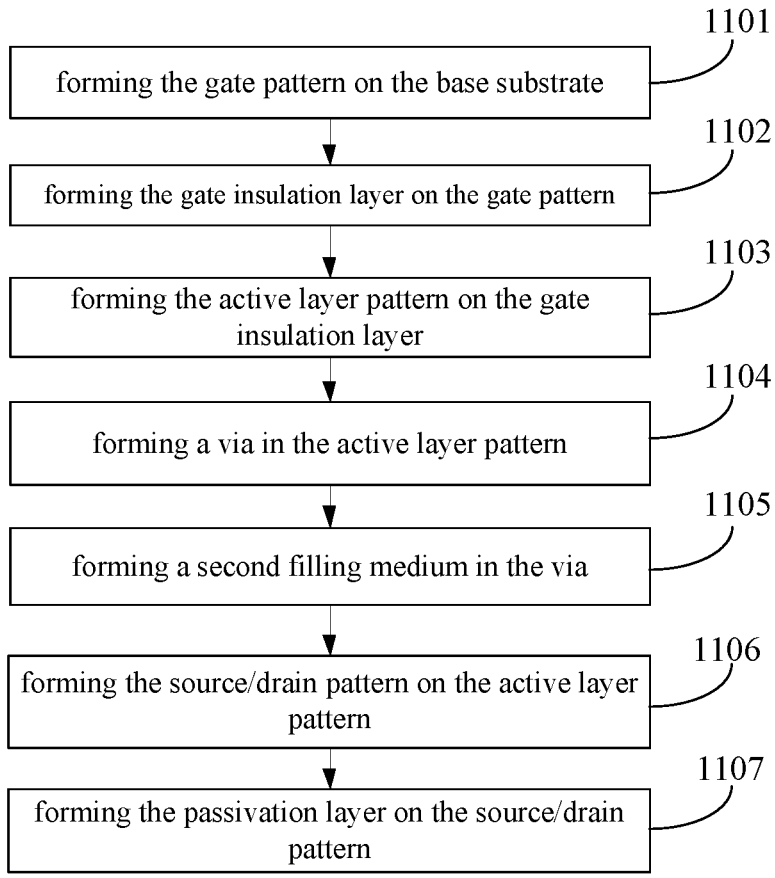
FIG. 11 is a flowchart of another method for fabricating a TFT according to an embodiment of the present disclosure.

In a second way for implementation, the gate pattern, the gate insulation layer, the active layer pattern, the source/drain pattern and the passivation layer in the TFT are sequentially formed in a stacking manner, and the unipolar conduction is realized by providing a filling medium in the active layer pattern. FIG. 11 is a flowchart of another method for fabricating a TFT according to an embodiment of the present disclosure, and the TFT fabricated by the method may have the structure as illustrated in FIG. 6. Referring to FIG. 11, the method may include steps 1101 to 1107.

In step 1101, the gate pattern is formed on the base substrate.

In some embodiments, a gate metal layer is formed on the base substrate by any one of processes such as deposition, coating, sputtering, and the like, and then the gate pattern is formed by performing one patterning process on the gate metal layer. The one patterning process may include steps of photoresist coating, exposure, developing, etching and photoresist removing.

In step 1102, the gate insulation layer is formed at a side of the gate pattern distal to the base substrate.

In some embodiments, the gate insulation layer film is formed on the base substrate, on which the gate pattern has been formed, by any one of processes such as deposition, coating, sputtering, and the like.

In step 1103, the active layer pattern is formed at a side of the gate insulation layer distal to the gate pattern.

In some embodiments, an active layer film is formed on the base substrate, on which the gate insulation layer has been formed, by any one of processes such as deposition, coating, spraying, and the like, and then the active layer pattern is formed by performing one patterning process on the active layer film. The one patterning process may include steps of photoresist coating, exposure, developing, etching and photoresist removing.

In step 1104, a via penetrating through the active layer pattern is formed in the active layer pattern.

In practice applications, the via may be already formed in the active layer pattern when the active layer pattern is formed in step 1103 by performing one patterning process on the active layer film.

In step 1105, a second filling medium is formed in the via.

In some embodiments, the second filling medium is made of a material having high mobility. For example, the second filling medium may be made of indium gallium zinc oxide, indium zinc oxide, low-temperature polysilicon, or molybdenum disulfide.

In some embodiments, the second filling medium may be formed in the via by a process of evaporation.

In step 1106, the source/drain pattern is formed at a side of the active layer pattern distal to the gate insulation layer.

In some embodiments, a source/drain film is formed on the base substrate, on which the active layer pattern has been formed, by any one of processes such as deposition, coating, sputtering, and the like, and then the source/drain pattern is formed by performing one patterning process on the source/drain film. The one patterning process may include steps of photoresist coating, exposure, developing, etching and photoresist removing.

In step 1107, the passivation layer is formed at a side of the active layer pattern and the source/drain pattern distal to the gate insulation layer.

In some embodiments, the passivation layer is formed on the base substrate, on which the source/drain pattern has been formed, by any one of processes such as deposition, coating, sputtering, and the like.

It should be noted that, the materials of film layers that are not specifically described in the second way for implementation may be understood with reference to the corresponding description in the first way for implementation, and not repeated in the embodiments of the present disclosure.

In should also be noted that, the method for fabricating a TFT in the above embodiments are illustratively described by taking a method for fabricating a bottom-gate TFT as an example. In practice application, the method for fabricating a TFT according to embodiments of the present disclosure may also be used to fabricate a top-gate TFT. Since the top-gate TFTs capable of achieving unipolar conduction provided in the embodiments of the present disclosure may be implemented to have different structures, the method for fabricating the top-gate TFT according to the embodiments of the present disclosure may be implemented in various ways. In the embodiments of the present disclosure, the following two ways for implementation of the method are illustratively described as examples.

Figure 12:
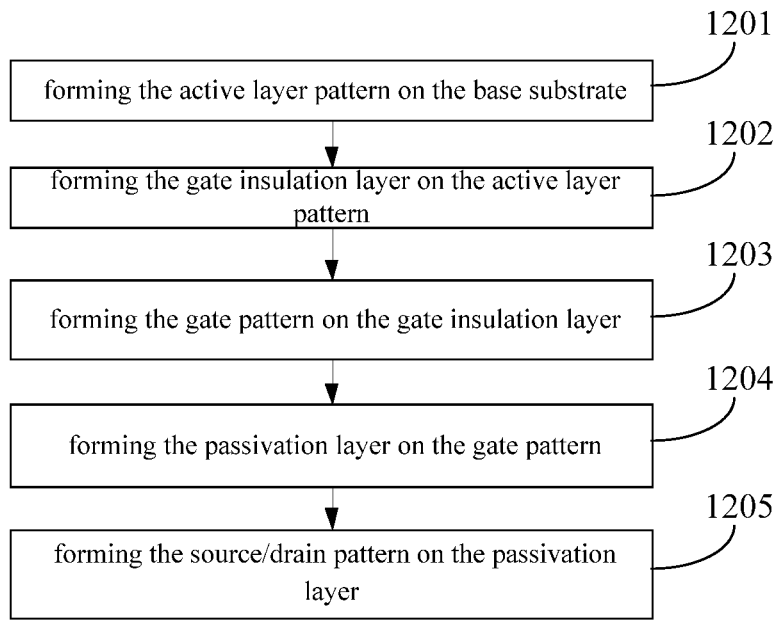
FIG. 12 is a flowchart of a method for fabricating a TFT according to another embodiment of the present disclosure.

In a first way for implementation of the method for fabricating the top-gate TFT, the active layer pattern, the gate insulation layer, the gate pattern, the passivation layer and the source/drain pattern are formed to be stacked sequentially, and the unipolar conduction is realized by a dual-gate TFT. FIG. 12 is a flowchart of a method for fabricating a TFT according to another embodiment of the present disclosure, and the TFT fabricated by the method may have the structure as illustrated in FIG. 8. Referring to FIG. 12, the method may include steps 1201 to 1205.

In step 1201, the active layer pattern is formed on the base substrate.

The process of step 1201 may be understood with reference to the corresponding process of step 1003, and not repeated in the embodiments of the present disclosure.

In step 1202, the gate insulation layer is formed at a side of the active layer pattern distal to the base substrate.

The process of step 1202 may be understood with reference to the corresponding process of step 1002, and not repeated in the embodiments of the present disclosure.

In step 1203, the gate pattern is formed at a side of the gate insulation layer distal to the active layer pattern.

The process of step 1203 may be understood with reference to the corresponding process of step 1001, and not repeated in the embodiments of the present disclosure.

In step 1204, the passivation layer is formed at a side of the gate pattern distal to the active layer pattern.

The process of step 1204 may be understood with reference to the corresponding process of step 1005, and not repeated in the embodiments of the present disclosure.

In step 1205, the source/drain pattern is formed at a side of the active layer pattern proximal to the gate insulation layer.

The process of step 1205 may be understood with reference to the corresponding process of step 1004, and not repeated in the embodiments of the present disclosure.

In the TFT formed by steps 1201 to 1205, the first active layer, the first gate insulation layer, the first gate electrode, the passivation layer and the first source/drain pattern are stacked sequentially, and the second active layer, the second gate insulation layer, the second gate electrode, the passivation layer and the second source/drain pattern are stacked sequentially. In some embodiments, an orthographic projection of the source/drain pattern on the active layer pattern is substantially non-overlapping with orthographic projections of the gate insulation layer and the gate pattern on the active layer pattern.

Figure 13:
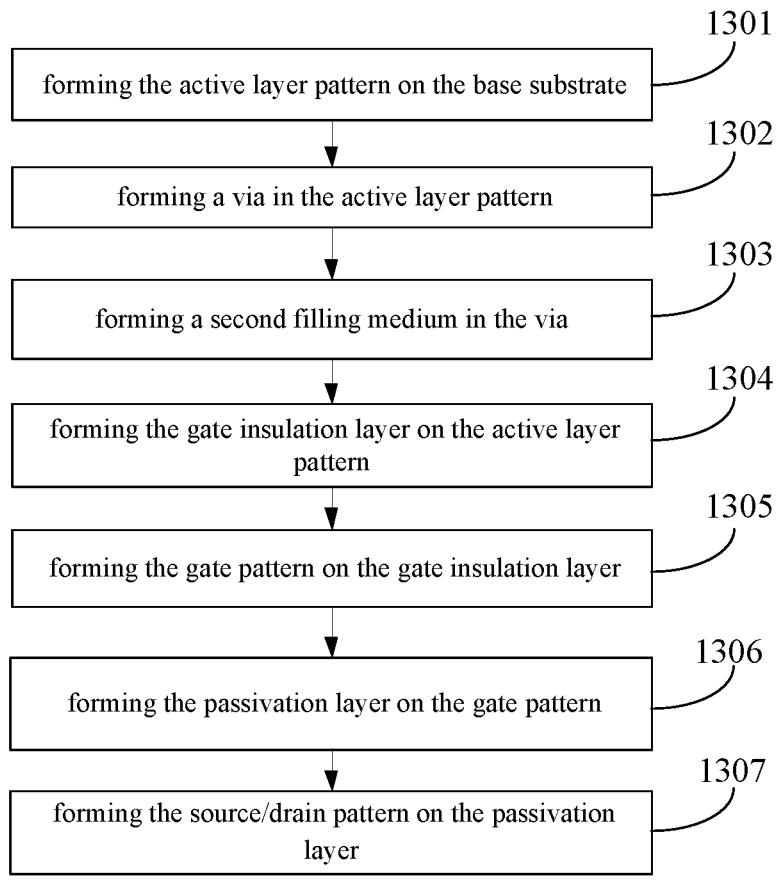
FIG. 13 is a flowchart of another method for fabricating a TFT according to another embodiment of the present disclosure.

In a second way for implementation of the method for fabricating the top-gate TFT, the active layer pattern, the gate insulation layer, the gate pattern, the passivation layer and the source/drain pattern in the TFT are formed to be stacked sequentially, and the unipolar conduction is realized by providing a filling medium in the active layer pattern. FIG. 13 is a flowchart of another method for fabricating a TFT according to another embodiment of the present disclosure, and the TFT fabricated by the method may have the structure as illustrated in FIG. 9. Referring to FIG. 13, the method may include steps 1301 to 1307.

In step 1301, the active layer pattern is formed on the base substrate.

The process of step 1301 may be understood with reference to the corresponding process of step 1103, and not repeated in the embodiments of the present disclosure.

In step 1302, a via penetrating through the active layer pattern is formed in the active layer pattern.

The process of step 1302 may be understood with reference to the corresponding process of step 1104, and not repeated in the embodiments of the present disclosure.

In step 1303, a second filling medium is formed in the via.

The process of step 1303 may be understood with reference to the corresponding process of step 1105, and not repeated in the embodiments of the present disclosure.

In step 1304, the gate insulation layer is formed at a side of the active layer pattern distal to the base substrate.

The process of step 1304 may be understood with reference to the corresponding process of step 1102, and not repeated in the embodiments of the present disclosure.

In step 1305, the gate pattern is formed at a side of the gate insulation layer distal to the active layer pattern.

The process of step 1305 may be understood with reference to the corresponding process of step 1101, and not repeated in the embodiments of the present disclosure.

In step 1306, the passivation layer is formed at a side of the gate pattern distal to the active layer pattern.

The process of step 1306 may be understood with reference to the corresponding process of step 1107, and not repeated in the embodiments of the present disclosure.

In step 1307, the source/drain pattern is formed at a side of the active layer pattern proximal to the gate insulation layer.

The process of step 1307 may be understood with reference to the corresponding process of step 1106, and not repeated in the embodiments of the present disclosure.

In summary, in the method for fabricating the TFT according to the embodiments of the present disclosure, the passivation layer prevents the charges on the surface of the carbon nanotube material from being mixed with water molecules and oxygen molecules in the air, and is made of the charge-resistant material capable of reducing the mobile charges on the surface of the carbon nanotube material, thereby reducing possibility of hysteresis in the TFT. In addition, the TFT is capable of achieving unipolar conduction.

Embodiments of the present disclosure further provide a display device including an array substrate, and the array substrate may include the TFT illustrated in FIG. 2, 4, 6, 8, or 9. The display device may be any product or component with display function, such as a liquid crystal panel, an electronic paper, a mobile phone, a tablet computer, a television, a monitor, a laptop, a digital photo frame, a navigator or the like.

Those of ordinary skill in the art could understand that all or part of the steps in the above embodiments may be implemented by hardware, or by instructing a relevant hardware using a program and the program may be stored in a computer-readable storage medium. The storage medium may be a read-only memory such as a magnetic disk, an optical disk or the like.

The foregoing descriptions are merely exemplary embodiments of the present disclosure and are not intended to limit the present disclosure. Any modification, equivalent replacement, and improvement made within the spirit and principle of the present disclosure shall be encompassed in the protection scope of the present disclosure.

What is claimed is:

1. A thin film transistor (TFT), comprising: a gate pattern, a gate insulation layer, an active layer pattern, a source/drain pattern, and a passivation layer,
wherein the active layer pattern is made of a carbon nanotube material, and the passivation layer is made of a charge-resistant material capable of reducing mobile charges on a surface of the carbon nanotube material,
the gate pattern comprises a first gate electrode and a second gate electrode arranged in one layer and electrically insulated from each other,
the gate insulation layer comprises a first gate insulation layer and a second gate insulation layer arranged in one layer,
the active layer pattern comprises a first active layer and a second active layer arranged in one layer and electrically insulated from each other,
the source/drain pattern comprises a first source/drain pattern and a second source/drain pattern arranged in one layer, the first source/drain pattern comprises a first source electrode and a first drain electrode arranged in one layer and electrically insulated from each other, the second source/drain pattern comprises a second source electrode and a second drain electrode arranged in one layer and electrically insulated from each other, and one of the first source electrode and the first drain electrode is electrically connected to one of the second source electrode and the second drain electrode, and
the first gate electrode, the first gate insulation layer, the first active layer, the first source/drain pattern and the passivation layer constitute a first sub TFT, and the second gate electrode, the second gate insulation layer, the second active layer, the second source/drain pattern and the passivation layer constitute a second sub TFT.

2. The TFT of claim 1, wherein
a gap is provided between the first gate electrode and the second gate electrode to electrically insulate and separate the first gate electrode and the second gate electrode from each other, and
a gap is provided between the first active layer and the second active layer to electrically insulate and separate the first active layer and the second active layer from each other.

3. The TFT of claim 2, wherein the gap between the first active layer and the second active layer is provided with a first filling medium made of an electrically-insulating and transparent material.

4. The TFT of claim 3, wherein
the first filling medium is made of silicon dioxide or silicon nitride.

5. The TFT of claim 2, wherein the gate pattern, the gate insulation layer, the active layer pattern, the source/drain pattern and the passivation layer are stacked sequentially, and
the passivation layer is at a side of the active layer pattern and the source/drain pattern distal to the gate insulation layer and covers the active layer pattern and the source/drain pattern.

6. The TFT of claim 2, wherein the active layer pattern, the gate insulation layer and the gate pattern are stacked sequentially,
the source/drain pattern is at a side of the active layer pattern proximal to the gate insulation layer, and an orthographic projection of the source/drain pattern on the active layer pattern is substantially non-overlapping with an orthographic projection of the gate insulation layer and the gate pattern on the active layer pattern, and
the passivation layer is at a side of the gate insulation layer and the gate pattern distal to the active layer pattern and covers the gate insulation layer and the gate pattern.

7. The TFT of claim 1, wherein
the passivation layer is made of aluminum oxide.

8. A method for fabricating a thin film transistor (TFT), the TFT being the TFT of claim 1, and the method comprising:
forming a gate pattern, a gate insulation layer, an active layer pattern, a source/drain pattern and a passivation layer on a base substrate,
wherein the active layer pattern is made of a carbon nanotube material, and the passivation layer is made of a charge-resistant material capable of reducing mobile charges on a surface of the carbon nanotube material,
the gate pattern is formed to comprise a first gate electrode and a second gate electrode formed in one patterning process and electrically insulated from each other,
the gate insulation layer is formed to comprise a first gate insulation layer and a second gate insulation layer formed in one patterning process,
the active layer pattern is formed to comprise a first active layer and a second active layer formed in one patterning process and electrically insulated from each other,
the source/drain pattern is formed to comprise a first source/drain pattern and a second source/drain pattern formed in one patterning process, the first source/drain pattern comprises a first source electrode and a first drain electrode formed in one patterning process and electrically insulated from each other, the second source/drain pattern comprises a second source electrode and a second drain electrode formed in one patterning process and electrically insulated from each other, and one of the first source electrode and the first drain electrode is electrically connected to one of the second source electrode and the second drain electrode, and
the first gate electrode, the first gate insulation layer, the first active layer, the first source/drain pattern and the passivation layer form a first sub TFT, and the second gate electrode, the second gate insulation layer, the second active layer, the second source/drain pattern and the passivation layer form a second sub TFT.

9. The method of claim 8, wherein a gap is formed between the first gate electrode and the second gate electrode to electrically insulate and separate the first gate electrode and the second gate electrode from each other, and a gap is formed between the first active layer and the second active layer to electrically insulate and separate the first active layer and the second active layer from each other, and
the method further comprises:
forming a first filling medium in the gap between the first active layer and the second active layer, wherein the first filling medium is made of an electrically-insulating and transparent material.

10. A method for fabricating a thin film transistor (TFT), the TFT being the TFT of claim 5, and the method comprising:
forming a gate pattern, a gate insulation layer, an active layer pattern, a source/drain pattern and a passivation layer on a base substrate, wherein the active layer pattern is made of a carbon nanotube material, and the passivation layer is made of a charge-resistant material capable of reducing mobile charges on a surface of the carbon nanotube material, the step of forming the gate pattern, the gate insulation layer, the active layer pattern, the source/drain pattern and the passivation layer on the base substrate comprises:

forming the gate pattern on the base substrate;

forming the gate insulation layer at a side of the gate pattern distal to the base substrate;

forming the active layer pattern at a side of the gate insulation layer distal to the gate pattern;

forming the source/drain pattern at a side of the active layer pattern distal to the gate insulation layer; and forming the passivation layer at a side of the active layer pattern and the source/drain pattern distal to the gate insulation layer, the passivation layer being formed to cover the active layer pattern and the source/drain pattern.

11. The method of claim 8, wherein the step of forming the gate pattern, the gate insulation layer, the active layer pattern, the source/drain pattern and the passivation layer on the base substrate comprises:

forming the active layer pattern on the base substrate;

forming the gate insulation layer at a side of the active layer pattern distal to the base substrate;

forming the gate pattern at a side of the gate insulation layer distal to the active layer pattern;

forming the passivation layer at a side of the gate pattern distal to the active layer pattern; and forming the source/drain pattern at a side of the active layer pattern proximal to the gate insulation layer, wherein an orthographic projection of the source/drain pattern on the active layer pattern is substantially non-overlapping with an orthographic projection of the gate insulation layer and the gate pattern on the active layer pattern.

12. A method for driving a thin film transistor (TFT), wherein the TFT is the TFT of claim 1, and the method comprises:

applying voltages having a same polarity to the first gate electrode and the second gate electrode, respectively, such that the TFT is in an on state; and applying voltages having different polarities to the first gate electrode and the second gate electrode, respectively, such that the TFT is in an off state.

13. A display device, comprising an array substrate, wherein the array substrate comprises the TFT of claim 1.

14. A thin film transistor (TFT), comprising: a gate pattern, a gate insulation layer, an active layer pattern, a source/drain pattern, and a passivation layer, wherein the active layer pattern is made of a carbon nanotube material, and the passivation layer is made of a charge-resistant material capable of reducing mobile charges on a surface of the carbon nanotube material, the active layer pattern is provided with a via penetrating therethrough, the via is between separate portions of the source/drain pattern, and filled with a second filling medium made of a material having such a mobility that only one type of carriers are allowed to pass through.

15. The TFT of claim 14, wherein the second filling medium is made of indium gallium zinc oxide, indium zinc oxide, low-temperature polysilicon, or molybdenum disulfide.

16. The TFT of claim 14, wherein the gate pattern, the gate insulation layer, the active layer pattern, the source/drain pattern and the passivation layer are stacked sequentially, and the passivation layer is at a side of the active layer pattern and the source/drain pattern distal to the gate insulation layer and covers the active layer pattern and the source/drain pattern.

17. The TFT of claim 14, wherein the active layer pattern, the gate insulation layer and the gate pattern are stacked sequentially, the source/drain pattern is at a side of the active layer pattern proximal to the gate insulation layer, and an orthographic projection of the source/drain pattern on the active layer pattern is substantially non-overlapping with an orthographic projection of the gate insulation layer and the gate pattern on the active layer pattern, the passivation layer is at a side of the gate insulation layer and the gate pattern distal to the active layer pattern and covers the gate insulation layer and the gate pattern, and the gate insulation layer completely covers the via.

18. A method for fabricating a thin film transistor (TFT), the TFT being the TFT of claim 14, and the method comprising:

forming a gate pattern, a gate insulation layer, an active layer pattern, a source/drain pattern and a passivation layer on a base substrate, wherein the active layer pattern is made of a carbon nanotube material, and the passivation layer is made of a charge-resistant material capable of reducing mobile charges on a surface of the carbon nanotube material, and the method further comprises:

forming, in the active layer pattern, a via penetrating through the active layer pattern, the via being between separate portions of the source/drain pattern; and filling a second filling medium in the via, the second filling medium being made of a material having such a mobility that only one type of carriers are allowed to pass through.

19. A display device, comprising an array substrate, wherein the array substrate comprises the TFT of claim 14.

20. The method of claim 18, wherein the step of forming the gate pattern, the gate insulation layer, the active layer pattern, the source/drain pattern and the passivation layer on the base substrate comprises:

forming the active layer pattern on the base substrate;

forming the gate insulation layer at a side of the active layer pattern distal to the base substrate;

forming the gate pattern at a side of the gate insulation layer distal to the active layer pattern;

forming the passivation layer at a side of the gate pattern distal to the active layer pattern; and forming the source/drain pattern at a side of the active layer pattern proximal to the gate insulation layer, wherein an orthographic projection of the source/drain pattern on the active layer pattern is substantially non-overlapping with an orthographic projection of the gate insulation layer and the gate pattern on the active layer pattern.

* * * * *